Feb. 22, 1966 S. J. LINS 3,236,707

ELECTRICAL CIRCUITRY AND METHOD

Filed May 24, 1963 2 Sheets-Sheet 1

INVENTOR
STANLEY J. LINS
BY Marvin Jacobson
ATTORNEY

Feb. 22, 1966 S. J. LINS 3,236,707

ELECTRICAL CIRCUITRY AND METHOD

Filed May 24, 1963 2 Sheets-Sheet 2

LOWER ELECTRODE

DIELECTRIC LAYER

UPPER ELECTRODE

INVENTOR
STANLEY J. LINS
BY Marvin Jacobson
ATTORNEY 3,236,707

ELECTRICAL CIRCUITRY AND METHOD

Stanley J. Lins, Minneapolis, Minn., assignor to Sperry Rand Corporation, New York, N.Y., a corporation of Delaware Filed May 24, 1963, Ser. No. 283,071
4 Claims. (Cl. 156—3)

This invention relates generally to improvements in the construction of electronic circuits. In particular this invention is directed toward improvements in the construction of what is presently known as microelectronic circuits.

Present day technology in the electronic art is being directed more and more towards microminiaturization of electronic circuits. In the same sense that semi-conductors, such as transistors and diodes, in combination with printed circuits, lead to a new generation of reduced size, high reliability electronic devices, microelectronic circuits are providing a further advance into a still newer generation of electronic devices. This is particularly true in the case of electronic digital computers which require large numbers of circuits and wiring interconnections therebetween but which must operate at extremely fast rates. Various methods for fabrication of microelectronics circuits have been suggested and are being investigated and utilized. The method of fabrication with which this invention is concerned includes what is generally referred to as the vacuum-deposition, thin-film fabrication and photo-imaging techniques. The prior art vacuum deposition technique utilizes a vacuum chamber in which material to form the electronic circuit is deposited on the major surface of a suitable substrate at reduced atmosphere. In some cases, the material is vaporized and the deposition pattern is determined by a mask placed between the source of the vaporized material and the substrate and the material is deposited on the substrate as a very thin film layer and adheres strongly thereto in the desired pattern. Other vacuum-deposition techniques also use masks located in the vacuum chamber for determining the circuit pattern. Active and passive circuit components, such as resistors, capacitors, transistors, diodes and the like, as well as the electrical interconnections therebetween are formed in this manner. In general, multiple thin-film layers each of conductive, dielectric or insulative materials in the desired selected patterns are deposited upon a single substrate. Although the foregoing is brief it should be sufficient to set the environment for the detailed description of this invention. More detailed description of the state of the art of microelectronic fabrication techniques is contained in the literature, for example an article by Carroll and Jenny, Electronics, May 19, 1961, pages 90–93 which is directed towards the vacuum-deposition thin-film fabrication technique.

Some problems and disadvantages have presented themselves in the above described vacuum-deposition technique of fabricating the microelectronic circuits. When attempting to form a circuit path of a very fine width, say in the order of ten microns, accurate resolution is virtually impossible when using a discrete mask between the vapor source and the substrate for defining the pattern of deposition. For multiple layer deposition, either all of the pattern masks for the respective layers must be initially placed within the vacuum chamber and positioned by some remote means, or the vacuum chamber must be disassembled and a new mask inserted for each layer to be deposited. This of course, is not only time consuming but may lead to impurities being deposited on the substrate unless extreme caution and control is taken. Another problem that occurs in multiple-layer deposition is the accurate indexing of the pattern of one superimposed layer to that of other layers since the circuitry on any given layer may be, and generally is, associated with circuitry on another layer and accurate alignment is required.

It is the object of this invention to provide improvements in the vapor-deposition technique of the fabrication of microelectronic circuits to obviate the foregoing stated disadvantages.

In the preferred embodiment of this invention, a thin-film layer of material, which eventually is formed into the electrical circuit pattern, is deposited as a continuous layer on a major surface of a suitable substrate of substantially non-conductive material. This may be done, for example, in the well known vapor-deposition manner although no limitation thereto is intended. A coating layer of material having relatively low vapor pressure and relatively low evaporation or sublimation temperature characteristics is deposited over the first layer, also as a continuous layer, in the vacuum chamber. For the purposes of this specification and the claims, these characteristics are defined in the following manner. When the coating layer material is on the substrate, its vapor pressure is such that under the conditions of the substrate temperature and ambient pressure within the vacuum chamber, substantially no evaporation takes place. As the temperature on the substrate is increased a relatively small amount, the vapor pressure of the coating layer also increases and when it exceeds the partial pressure of the surrounding atmosphere, evaporation or sublimation occurs with negligible melting or flowing of the material. A mask containing the pattern to be formed in a magnified scale, say in the order of 40 times larger, is inserted into a projection system located external to the vacuum chamber and a demagnified image of the pattern in the mask, reduced to the desired size by appropriate optical techniques, is projected onto the thin-film layer on the substrate in the vacuum chamber. The image is projected using certain energy sources in a manner as to form a protective coating over the area of the thin-film defined by the mask pattern. All the area of the films on the substrate, except for the protected areas, are then removed from the substrate by a suitable etching process, preferably by gaseous etching, and that which remains is the desired circuit pattern. Successive layers of selected conductive and dielectric materials are then deposited in turn and the circuit patterns formed in an identical manner to provide the multiple-layer circuits. Since the only thing changed or moved during the entire fabrication process is the magnified mask external to the vacuum chamber, each successive circuit pattern can be accurately indexed and aligned with respect to one another. Further, no time is consumed in disassembling the vacuum chamber and no problem of impurities attaching themselves to the circuits is encountered.

These and other more detailed and specific features will be disclosed in the course of the following specification, reference being had to the accompanying drawings, in which.

Figure 6A:
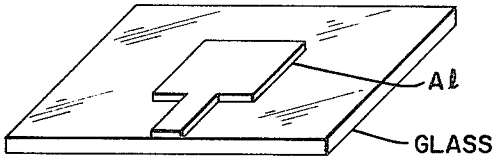

FIGS. 6A, B and C illustrate formation of a multiple-layered circuit.

Figures 1, 2, 4:
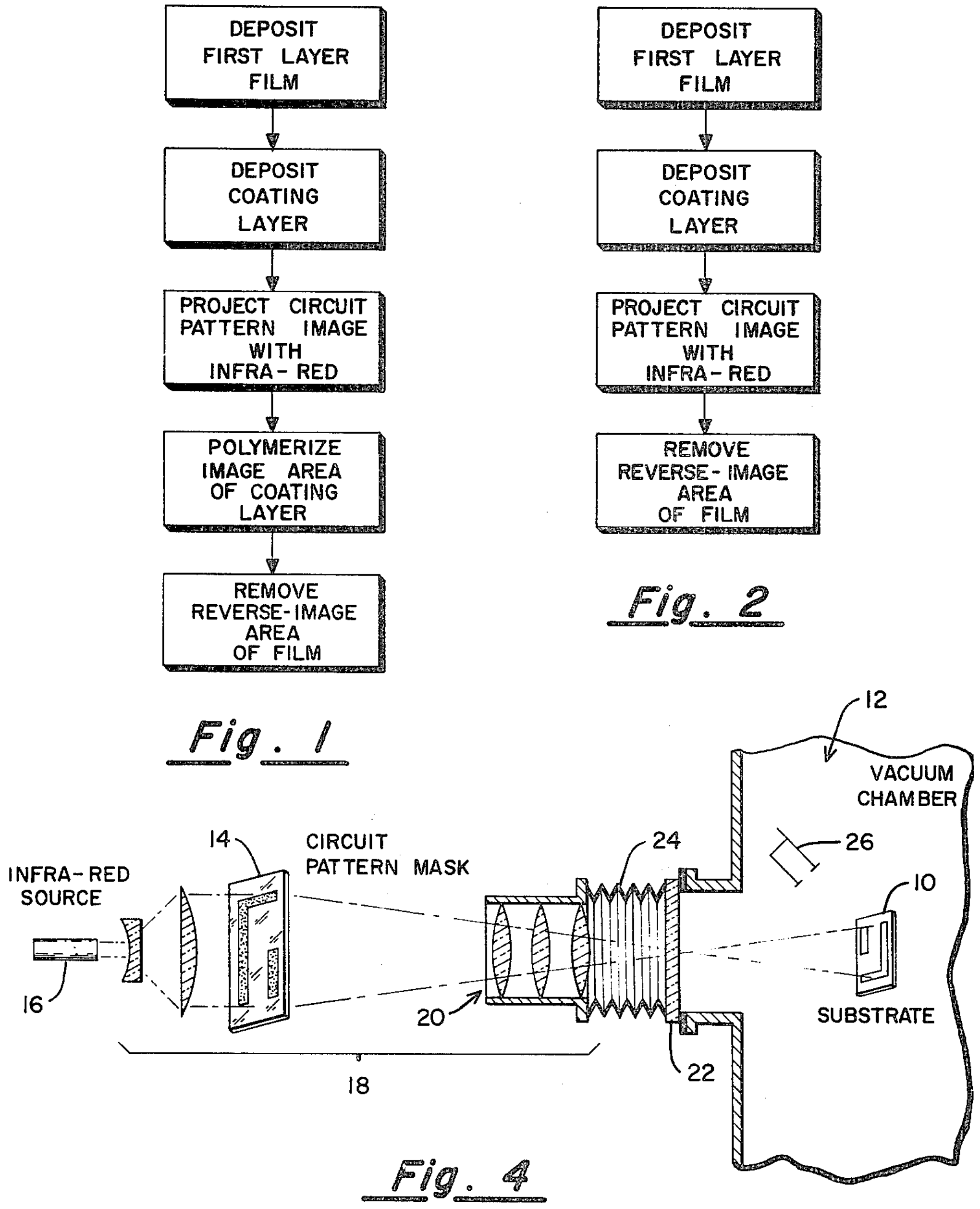
FIG. 1 is a flow chart illustrating the preferred process of this invention.
FIG. 2 is a flow chart of a modification of the preferred process of FIG. 1.
FIG. 4 illustrates in part apparatus for effecting the preferred process of FIG. 1.
Figure 3:
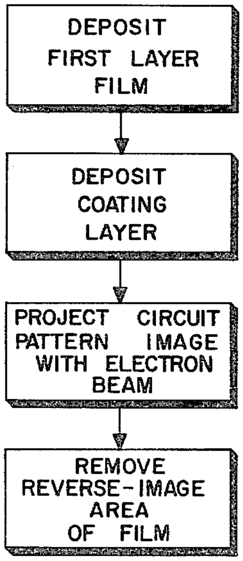
FIG. 3 is a flow chart illustrating a further process contemplated by this invention.

In all three of the flow charts of FIGS. 1–3 the first two steps in the processes are respectively; depositing a film of material, which eventually will form the circuit pattern, on a suitable planar substrate, and depositing a coating layer over the film. Although these first two steps are essential in the processes of this invention, the particular method used in these steps is well known in the art and is not considered a part of the invention. However, the type of material used as the coating layer must have the required characteristics as described herein so as to react properly during the subsequent steps of this novel process. The Carroll article, supra, describes in some detail suitable deposition techniques for these first two steps. Additionally a report on Research in Microelectronics Using Electron-Beam-Activated Machining Techniques by Kenneth R. Shoulders of Stanford Research Institute (ASTIA Report AD 243,675), pages 89–96 describes in still more detail thermal-evaporation techniques for depositing layers of material on a substrate. The first two steps in the processes are briefly described as follows, with reference to FIGS. 4 and 5 where appropriate. The substrate 10 is placed in a suitable holding fixture, not shown, in a vacuum chamber indicated in part at 12. In a typical case the substrate may be of a glass material. The vacuum chamber is then evacuated in any well-known manner, not shown in the figures, to reduce the atmosphere to a suitable level, for example in the order of $1\times10^{-6}$ mm. Hg. The material to be initially deposited on a major surface of the substrate, in a typical case, is contained in a crucible inside the vacuum chamber and is vaporized by the application of heat. The vapor is directed toward the surface of a substrate to form a continuous layer thereover. This material may be aluminum, for example, which will eventually be formed into the circuit pattern. The rate of evaporation, the thickness of the deposit, the uniformity of deposit, etc. are all monitored by proper instrumentation to control the evaporation process of the first layer of film material. In a typical case this film may be deposited to a uniform thickness in the order of 2000 A. A coating layer is then deposited over the film layer and this will eventually form, over selective areas thereof, a protective coating over the first film layer of material. Typically the manner of deposition is similar to that of the deposition of the first layer film. The Shoulders report supra, pages 121–127, describes in detail the manner of deposition of such a coating layer. In this invention, the coating layer is characterized by its relatively low vapor pressure and relatively low evaporation or sublimation temperature, as previously defined. As contemplated by this invention, the preferable material would be that of a class consisting of triphenylsilanol and diphenylsilanodiol which are solid at room temperatures but can be evaporated onto a surface to produce a thin coating film. It is within contemplation of this invention that other compounds having the above-stated required characteristics can be used.

We will now consider the third step in the processes illustrated by the flow of charts of FIGS. 1 and 2 with particular reference to FIG. 4. The pattern to be formed is laid out on mask 14 located external to the vacuum chamber 12 to a scale substantially magnified from that of the desired size of the circuit. The source of illumination, 16, for projecting the image of the pattern on the substrate layers is a source of infra-red energy which may be a laser. The projection system is shown generally as bracketed by 18 and the dashed lines only serve to indicate in the well-known manner how the image is projected onto the surface of the substrate 10. There is no intent to show in the figure the actual structural requirements for the lenses used in the projection system, the only intent being to schematically illustrate the functional operation of a typical apparatus for performing the step in the process. It should be recognized that the projection system shown is illustrative and not limitive. Projection can be effected by other systems while still achieving the features and advantages of the invention. For example, it is contemplated that the projection system can include mirrors or prisms or combinations thereof.

The collimated light from the infra-red source 16 is directed by the lenses in the proper manner to provide the illumination for the transmission of the image of the circuit pattern from mask 14 through a further set of lenses, shown generally at 20, and an infra-red window 22 on the wall of the vacuum chamber onto the surface of the substrate 10. The bellows 24 allows proper focusing of the image. As illustrated in FIG. 4, the circuit pattern image on mask 14 is a substantial magnification of the desired circuit pattern and in a typical case may be in the order of 40 to 1 magnification. Depending upon the particular light source, a simple chromatic lens system or achromatic lenses may be used in the projection system. The area of the mask 14 corresponding to the circuit pattern is opaque and the remainder thereof is transparent with the result that the area of the coating layer corresponding to the reverse image of the circuit pattern is exposed to the infra-red radiation. The impingement of the infra-red upon the selected area of the coating layer causes local heating with resulting sublimation or evaporation of the material. The unexposed area, the area corresponding to the desired circuit pattern, will not sublimate or evaporate. It should be pointed out that it has not been accurately determined whether sublimation or evaporation or both take place, but what does take place is effectively equivalent to sublimation. This is true since the rate at which the exposed coating layer material vaporizes is so rapid that there is negligible melting and substantially no flowing of the material. In this manner, then, except for the area corresponding to the desired circuit pattern, the coating material will have been removed. In projecting the circuit pattern image onto the substrate, as described above, it is important that the energy from the infra-red source effect the image formation on the substrate in a short period of time so that there is substantially no thermal-conduction across the substrate. Excessive thermal-conduction can result in undesirable flowing of material and imperfections in the formation of the circuit pattern. It has been found that a powerful infra-red energy impulse of short duration can be generated by a laser, which makes this device highly desirable for use in this invention.

To this juncture the steps in the processes illustrated by the flow charts of FIG. 1 in FIG. 2 are identical. The fourth step in the process illustrated in FIG. 1 involves effectively changing that area of the coating layer not previously removed by the infra-red into a material which will act as a protective coating for the first layer of thin-film material during the subsequent etching step. This is done by subjecting the coating layer to a shower of low energy electrons or ions or deep ultra-violet light to polymerize, disassociate or cross-link the remaining area of the coating layer, depending on the type of material and the energy source, to form a protective mask over the thin-film material. In the Shoulders report, supra, page 124, the polymerizing of the coating layer film by a beam of electrons is described. A source of ions or electrons for use in this step is located within the vacuum chamber 12 as indicated at 26 in FIG 4. This step in the process, effectively changes the coating layer into a material having vapor pressure characteristics lower than that when initially deposited and evaporation or sublimation temperature considerably higher than previous so that the remaining coating layer is substantially unaffected during the following etching step. After the area of the coating layer defining the desired circuit pattern has been effectively changed to provide the protective coating, the final step, etching, in the process of FIG 1 takes place. Any well-known manner of etching can be used and the choice of etchant is dependant upon the type of material being etched. In the Shoulders article supra, pages 111–119, three somewhat similar methods for etching are described which are: molecular beam etching; atomic beam etching; and etching by ion sputtering. As stated by Shoulders in his article, page 113, any known material may be etched by an available gas or a compound and fairly simple rules can be used in selecting the proper etching temperature and etchant. The gaseous etchant is applied to the material on the substrate from a source not shown. The unprotected area of the first layer of thin-film material reacts with the gas to effect a chemical transformation of the material into a volatile by-product. The entire substrate is then subjected to heat to drive off the volatile by-product. The remaining portion, with the protective coating layer, forms the desired circuit pattern on the substrate.

At this juncture it is worthwhile considering a few items of interest relative to the structural diagram of FIG 4. In order to maintain the reduced atmosphere in the vacuum chamber and to prevent contaminants from entering therein, the infra-red window 22 must be hermetically sealed to the outer casing of the vacuum chamber and is indicated in the diagram as being done by a suitable adhesive. Obviously, other means for maintaining the hermetic seal are within contemplation. A suitable holding fixture for the mask 14 is not shown in the diagram, and again this is a matter of choice. The only essential feature required of this holding fixture is that it includes some accurate means for indexing the various masks as they are selectively inserted in the holding fixture to retain the accurate indexing of the circuit patterns for the respective layers when fabricating multiple-layered circuits. Lastly, as stated above, the infra-red source 16 may be a laser to provide the short duration, high energy impulse.

To summarize the description of the process illustrated in FIG 1, we will now go through the step-by-step formation of a simple circuit pattern, with reference to FIG. 4, where applicable. The circuit pattern to be formed may be that, for example, as shown in FIG 6A, comprising a rectangular shaped film of aluminum with an elongated tab extending from one side. The glass substrate 10 is initially placed in a suitable holding fixture in the vacuum chamber 12 and crucibles of the materials to be used are also placed in the chamber. The crucible of aluminum is heated to sufficient temperature to vaporize the aluminum and the vapor is directed toward and deposited on the surface of the glass substrate as a continuous layer. The vaporization rate and deposition thickness is monitored and controlled by instrumentation until a uniform layer of aluminum in the order of 2,000 A. thickness has been deposited. After a sufficient cooling period, the crucible containing triphenylsilanol is heated to cause the material to vaporize and be deposited as a covering layer over the thin layer of aluminum. A mask 14, with the desired circuit pattern formed with opaque material and the remainder with a transparent material, is placed in a suitable holding fixture in the projection system 18. The infra-red energy source, 16, is energized to provide an impulse of infra-red energy to project the image onto the coating layer on the substrate. The area corresponding to the desired circuit pattern is not subjected to the infra-red energy while the remaining area is. The area of the coating layer corresponding to the reverse image of the desired circuit pattern sublimates or evaporates as a result of the action of the infra-red energy. The substrate then is subjected to a shower of low-energy electrons or ions from source 26 which polymerizes the remaining coating layer. Following the polymerization, an etchant gas, such as chlorine, is applied to the substrate which reacts with the unprotected area of the aluminum to yield $AlCl_3$ which is a material which sublimates at approximately 177° C. Subsequent application of heat in the order of this sublimation temperature in the vicinity of the substrate causes the aluminum chloride to sublimate and be driven off of the substrate. The remaining protected layer of aluminum is the desired circuit pattern which, for example, may form one plate of a capacitor.

If it is considered desirable to remove the coating layer subsequent to etching, a further step should be included. Subsequent to polymerization, either before or after etching, a controlled amount of oxygen can be introduced into the chamber at proper temperature to reduce the coating layer material to a silicon oxide which is then readily removable by the application of hydrogen-fluoride.

The process illustrated in FIG. 2 is a modification of that of FIG. 1. In the former, one of the steps in the latter has been eliminated. The first three steps in the process of FIG. 2 are identical to those in the process of FIG. 1 so that it can be assumed, as previously described, that after the third step there is a coating layer over the area corresponding to the image of the desired circuit pattern. At this juncture the etchant gas, such as chlorine, can be applied to combine with the unprotected portion of the first thin-film layer, which for example may be aluminum, to effect a chemical transformation of the latter into a volatile by-product. That part of the aluminum covered by the coating layer will not be subject to any reaction with the etchant gas. It should be recognized that this must be done without raising the temperature in the vicinity of the substrate to a degree sufficient to drive off the coating layer material during the application of the etchant gas. Once the volatile by-product has been formed, however, the temperature is increased to drive off both the volatile by-product and the coating layer material so that which remains is the desired circuit. This process is particularly useful where it is desirable to superimpose one circuit pattern in juxtaposition with another to effect electrical interconnection therebetween. Although the elimination, in the process of FIG. 2, of the step of polymerizing the coating layer would effect a saving in time as compared to that of FIG. 1, it should be recognized that greater care must be taken during etching to ensure that the coating layer is not removed while the etchant gas is being applied. From the foregoing description of the processes illustrated in FIGS. 1 and 2 it can be seen that either one or a combination of both can be used to fabricate multiple-layered circuitry. In a typical case, the bottom and top layers may be formed according to the process of FIG. 2 while the intermediate layers may be formed according to the process of FIG. 1, with no limitation thereto intended.

Figure 6B:
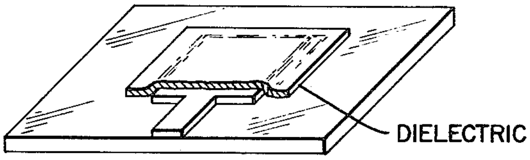
Figures 5, 6C:
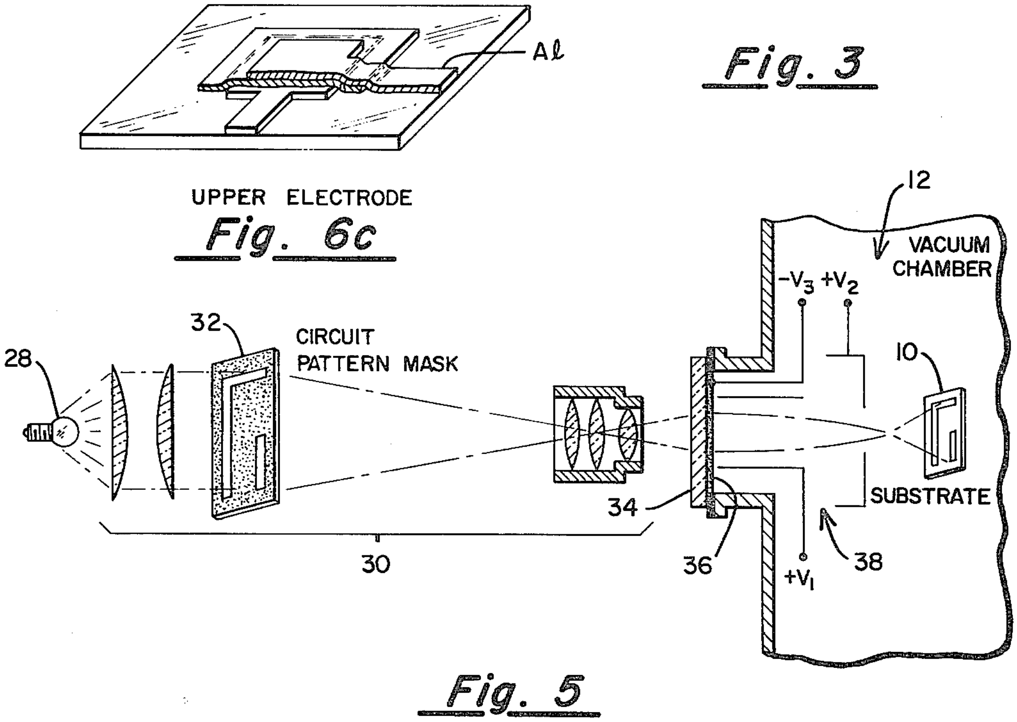
FIG. 5 illustrates in part an apparatus for effecting the process illustrated in FIG. 3.

There will now be described a further embodiment of the inventive process, as illustrated in FIG. 3, with reference to the illustrative apparatus of FIG. 5 where necessary. The first two steps of this latter process are identical to those of the processes of FIG. 1 and FIG. 2. In a generic sense the third step is similar to that of FIGS. 1 and 2, however, the image of the desired circuit pattern is projected onto the coating layer in a different manner. The circuit pattern mask 32 is placed in the projection system bracketed at 30 and an illuminating source 28 is energized. The area of the mask corresponding to the desired circuit pattern is made transparent and the remainder is opaque so that light from the source arranged in a pattern corresponding to the desired circuit is projected onto window 34 which is hermetically sealed on the wall of the vacuum chamber 12. It should be recognized that the lenses shown in the projection system 30 are not intended to be illustrated in their proper configuration and that design of a projection system suitable for use in this invention is well within the ability of one of ordinary skill in the art. The inside surface 36 of window 34 is coated with a photo-sensitive material such as selenium. When the light impinges upon the window over an area corresponding to the desired circuit pattern, electrons are displaced from the inside surface 36 in the same pattern. The accelerating and focusing grids, shown generally in the well-known manner at 38, direct the pattern of electrons at the proper acceleration onto the coating layer on the substrate 10. The magnitude of the potentials +V1, +V2 and −V3 to provide the proper electrostatic fields are, of course, readily determinable by one of ordinary skill in the art. The projection system 30, of course, must include lenses to demagnify the image down to the desired size from that on mask 32. The electron beam in the desired circuit pattern formation, upon impinging the coating layer on the substrate 10, effectively polymerizes, disassociates or cross-links the corresponding selected area of the coating layer, depending on the type of material used for coating. This provides a protective coating over the selected area of the first layer thin-film material so that the image of the desired circuit pattern has now been projected on to the layers on the substrate.

The final step of removing the uprotected areas of the thin-film material may be effected in the identical manner as described in relation to FIG. 1, although it is contemplated that the etching can be accomplished in other ways. Furthermore, it may be desirable to change the coating layer material to a silicon oxide to make to more readily removable as previously described.

In the same manner that the processes of FIGS. 1 and 2 can be utilized to fabricate multiple-layered circuits, the process illustrated in FIG. 3 incorporating electron beam projection of the image on the substrate can be utilized with the resulting advantages and features of this invention. FIGS. 6A–C are included to pictorially illustrate the formation of a relative simple multiple-layer circuit. One plate of a capacitor is formed from a thin layer of aluminum on the glass substrate and has a tab extending from one side to provide external electrical connections. A layer of dielectric, which for example may be a relatively thick lamina of triphenylsilanol, is formed in a pattern to substantially cover the aluminum plate while still leaving at least a portion of the tab extending uncovered. Finally the other capacitor plate, which also may be of aluminum, is formed over the dielectric layer accurately indexed with respect to the first plate, and also has an extending tab for external electrical connection. Each one of the respective layers may be formed by using one or a combination of the illustrative fabrication processes described above.

Although the preferred processes using infra-red illumination for projecting the circuit pattern image have been described wherein the area of the coating layer corresponding to the reverse image of the circuit pattern is sublimated by the infra-red, it is contemplated that the opposite may be done within the teachings of this invention. For example, the mask may be such that the circuit pattern is transparent and the remainder of the mask is opaque. The infra-red energy would then impinge upon the area of the coating layer corresponding to the circuit pattern. This area may subsequently be etched or treated in the desired manner. This could provide a method for making selective electrical interconnections between layers of circuits while retaining insulating or dielectric material between other portions of the layered circuits.

It is understood that suitable modifications may be made in the processes as disclosed provided such modifications come within the spirit and scope of the appended claims. Having now, therefore, fully illustrated and described my invention, what I claim to be new and desire to protect by Letters Patent is:

1. A method of fabricating microelectronic circuits in situ in a vacuum chamber comprising:

depositing a first film of aluminum on a glass substrate;

depositing a second film of a material, selected from the class consisting of triphenylsilanol and diphenylsilanodial, on said first film;

removing selected areas of said second film, defining the reverse image of a desired circuit pattern, by exposing said selected areas to infra-red radiation, thereby exposing corresponding areas of said first films; and removing said exposed areas of said first film by gas etching.

2. A method as defined in claim 1 including the step of polymerizing the remaining portion of said second film before the exposed area of said first film is removed by irradiating the remaining portion of said second film with a radiation source selected from the group consisting of ions, electrons, and ultra-violet located within the vacuum chamber.

3. A method as defined in claim 2 in which the exposed area of said first film is removed by exposure to chlorine gas.

4. A method as defined in claim 3 including the step of removing the remaining portion of said second film by applying heat after the exposed portion of said first film is removed.

References Cited by the Examiner

UNITED STATES PATENTS

| | | | |
|---|---|---|---|
| 2,744,000 | 5/1956 | Seiler | 156—7 |
| 3,077,150 | 2/1963 | Schaffert | 95—1.7 |
| 3,095,340 | 6/1963 | Triller | 156—8 |
| 3,113,896 | 12/1963 | Mann | 156—3 |
| 3,180,751 | 4/1965 | Law | 156—13 X |

OTHER REFERENCES

White et al.: IBM Disclosure Bulletin, vol. 5, No. 3, August 1962, Preparation of Metal-Dielectric Mixtures for Microminiaturized Circuitry.

ALEXANDER WYMAN, *Primary Examiner.*

JACOB STEINBERG, *Examiner.*